United States Patent
Bieri et al.

(10) Patent No.: US 8,314,618 B2
(45) Date of Patent: Nov. 20, 2012

(54) MAGNETIC RESONANCE METHOD FOR QUANTIFICATION OF TRANSVERSE RELAXATION TIMES

(75) Inventors: Oliver Bieri, Liestal (CH); Klaus Scheffler, Basel (CH)

(73) Assignee: University Hospital of Basel, Basel (CH)

( * ) Notice: Subject to any disclaimer, the term of this patent is extended or adjusted under 35 U.S.C. 154(b) by 412 days.

(21) Appl. No.: 12/732,694

(22) Filed: Mar. 26, 2010

(65) Prior Publication Data
US 2011/0234225 A1    Sep. 29, 2011

(51) Int. Cl.
*G01V 3/00* (2006.01)
(52) U.S. Cl. ........................ 324/309; 324/307
(58) Field of Classification Search .......... 324/300–322; 600/407–445
See application file for complete search history.

(56) References Cited

U.S. PATENT DOCUMENTS

| | | | |
|---|---|---|---|
| 7,253,620 B1 * | 8/2007 | Derbyshire et al. | 324/307 |
| 7,262,599 B2 | 8/2007 | Ganter | |
| 7,880,466 B2 * | 2/2011 | Derbyshire et al. | 324/307 |

OTHER PUBLICATIONS

Ganter, "Steady state of gradient echo sequences with radiofrequency phase cycling: Analytical solution, contrast enhancement with partial spoiling," in Magnetic Resonance in Medicine, vol. 55, 2006, pp. 98-107.

Deoni et al., "Rapid combined T1 and T2 mapping using gradient recalled acquisition in the steady state," in Magnetic Resonance in Medicine, vol. 49, 2003, pp. 515-526.

Crooijmans et al., "Influence of MT effects on T2 quantification with 3D balanced steady-state free precession imaging," in Magnetic Resonance in Medicine, 2010, in press.

* cited by examiner

*Primary Examiner* — Brij Shrivastav
(74) *Attorney, Agent, or Firm* — Joyce von Natzmer; Agris & von Natzmer LLP

(57) ABSTRACT

Apparatus and methods for quantification of transverse relaxation times (T2) using steady-state free precession sequences (generally known as fast imaging sequences) and their sensitivity to a quadratic increase of the RF pulse phase, also known as RF spoiling. Using at least two image acquisitions with different partial RF spoiling increments, T2 can be assessed with high precision and with short acquisition times in the limit of large excitation angles being independent on the longitudinal relaxation time (T1) and magnetization transfer effects as compared to other SSFP based quantitative T2 methods. This invention is not restricted to any kind of target and may be applied in 3D as well as in 2D.

14 Claims, 4 Drawing Sheets

(A) (B)

(A) (B) (C)

MAGNETIC RESONANCE METHOD FOR QUANTIFICATION OF TRANSVERSE RELAXATION TIMES

FIELD OF THE INVENTION

This invention relates to apparatus and methods for the quantification of transverse relaxation times (T2), for example, for biological tissues such as, but not limited to, brain including, e.g., grey and white matter, muscle and/or cartilage.

BACKGROUND OF THE INVENTION

Magnetic resonance imaging (MRI) refers to an imaging technique for visualization of primarily tissue structure and function. The strength of the magnetic resonance (MR) signal depends on the relative density of excited nuclei, on relaxation properties (longitudinal T1 and transversal T2 relaxation), on the signal upon excitation and other parameters such as, but not limited to, flow and chemical shifts. As a result, the contrast in an MR image is per se a mixture of all these effects and would, if used as such, lack diagnostic specificity. However, dedicated imaging sequences can emphasize one specific effect, such as the transverse relaxation time (T2), yielding a so called T2-weighted image, a term that already insinuates that the contrast in the image is dominated by T2. It is, however, also evident from the term that in such an image only the contrast in the image is weighted by the specific tissue property but that it does not represent an actual measure of this specific tissue property. As a result, MRI often provides only a qualitative imaging technique that is focused on the analysis of either hyper- or hypo-intense appearing blobs, which represent tissue abnormalities. In contrast, a real quantification of biochemical or biophysical tissue parameters offers many advantages, in particular, it allows quantifying alterations in biological tissue resulting from disease or a particular treatment regime. Quantitative rather than qualitative imaging also provides the advantage that the measurements are independent of the MRI system used, non-biased, reproducible and/or offer much less room for interpretation. Although quantification is in many ways superior to qualitative MRI, methods and apparatuses available require much more MRI scanner time and data analysis can be very time consuming. As a result, fast, reliable and easy methods for quantitative MRI are highly desirable.

The publications and other materials, including patents, used herein to illustrate the invention and, in particular, to provide additional details respecting the practice are incorporated herein by reference. For convenience, the non-patent publications are referenced in the following text by author and date and are listed in the appended bibliography.

The image contrast as achieved with available MR imaging sequences generally depends heavily on either the longitudinal (T1) or the transverse relaxation (T2) time. Since most disease related tissue alterations, such as, but not limited to, inflammations, result in a modification of the transverse relaxation time, T2 is one of the most important tissue parameter and thus fast and accurate methods for measuring T2 are clinically of great importance (Boulby & Rugg-Gunn, 2003). State-of-the-art T2 quantification techniques are usually based on two dimensional (2D) single or multi spin-echo (SE) sequences (Boulby & Rugg-Gunn, 2003). Although the SE-based methods yield accurate estimates of T2 in combination with good anatomical information, they suffer from long acquisition times, making it clinically unattractive. Other quantitative T2 imaging techniques make use of fast imaging sequences, such as steady-state free precession (SSFP) techniques, where the steady-state signal is a weighted combination of T1 and T2 (Deoni et al., 2003). SSFP-based quantification of T2 is thus mainly interesting in combination with a measurement of T1, since this information is practically needed. Furthermore, only recently, systematic deviations in the assessed T2 and T1 values from the true T1 and T2 tissue parameters were observed for SSFP-based methods due to magnetization transfer effects arising from the methodologically required variation in the excitation angle (Crooijmans, et al, 2010; in press). As a result, a T1 and SSFP imaging sequence parameter related independent quantitative T2 imaging technique is highly desirable.

In view of the above, it is apparent that there exists a need in the art for imaging methods and/or apparatus which solve or at least ameliorate one or more of the above drawbacks of the prior art. It is a purpose of this invention to fulfill this need in the art as well as other needs which will become more apparent to the skilled artisan once given the following disclosure.

SUMMARY OF THE INVENTION

Generally speaking, this invention fulfills, in one embodiment, the above described needs in the art by providing:
a method of magnetic resonance imaging comprising:
acquiring a first magnetic resonance image generated with low, including in certain embodiments zero, partial radio frequency (RF) spoiling increments;
acquiring a second magnetic resonance image generated with slightly increased partial RF spoiling increments as compared to previously acquired first magnetic resonance image;
combining the first and the second magnetic resonance images to obtain a quantitative T2 image.

In one embodiment, the present invention is directed at a magnetic resonance imaging (MRI) method for quantification of a transverse relaxation time (T2) comprising
subjecting a sample to a first partially spoiled SSFP (pSSFP) scan having a first partial radio frequency (RF) spoiling increment $\phi_1$ and acquiring from said scan a first MRI image of said sample,
subjecting said sample to a second pSSFP scan with a second partial RF spoiling increment $\phi_2$ and acquiring from said scan a second MRI image of said sample, wherein $\phi_2 \neq \phi_1$ including $\phi_2 > \phi_1$ or $\phi_2 < \phi_1$,
deriving a map of the T2 from said first and second image, wherein said map quantifies T2 for tissue in said sample.

Tissue may includes, but is not limited to, brain tissue, muscle or cartilage (for tissues according to the present invention T1/T2>>η with α>50°).

$\Phi_1$ and $\phi_2$, respectively may be less than about 50°, about 40°, about 30°, about 20°, most preferably less than or equal to 10°, 9°, 8°, 6°, 5°, 4°, 3°, 2°, 1° or 0°. $\Phi_1$ and $\phi_2$ may differ from each other, e.g., by 10°, 9°, 8°, 6°, 5°, 4°, 3°, 2° or 1°. In this and other embodiments of the invention, both $\phi_2$ and $\phi_1$ may each be less than 20°, 15° and most preferably less than 10°.

In a preferred embodiment, whole brain mapping in 3D may be performed in less than 5 minutes, less than 4 minutes, preferably less than 3 minutes. A single slice (2D) of material (such as brain) may be mapped in less than 40 seconds, less than 30 seconds, preferably less than 20 seconds.

Any sample of the present invention may be subjected to at least one, including, e.g., 2, 3, 4, 5, 6, 7, 8, 9, 10 pSSFP additional scans in addition to said first and second scan having a partial spoiling increment $\phi_y$, wherein $\phi_y \neq \phi_1$, $\phi_2$ and $\phi_x$, wherein $\phi_x$ is any partial spoiling increment of scans preceding $\phi_y$. From each additional scan further MRI image of the sample may be acquired and a map of the T2 may be derived from said first, second and said at least one further image.

The flip angle of the RF pulses of said pSSFP of said first, second and any additional scan may exceed or be equal to 50° or 60°, more preferably exceed or be equal to 70°, more preferably exceed or be equal to 80°. In this case, the signals making up the map are generally independent of a longitudinal relaxation time (T1).

However, a T1 may be provided in different embodiments of the present invention. E.g., the provided T1 may have been acquired by subjecting said sample to a method for quantifying T1 or from data previously obtained for one or more previous samples. This data is optionally an average value or an approximation of an average value.

The pulse sequence repetition time (TR) of the RF pulses may be more than or equals 3 ms, but less than 15 ms, preferably more than 5 ms, but less than 10 ms including more than 6 ms, 7 ms, 8 ms or 9 ms.

A flip angle of the RF pulses of said pSSFP of said first, second and any additional scan may be less than 60°, preferably less than or equal to 50° or 40°, even more preferably less than or equal to 30° rendering T2 of the respective pSSFP dependent on a longitudinal relaxation time (T1). In this case the T1 is preferably provided, e.g., by subjecting said sample to a method for quantifying T1, or from data previously obtained for one or more previous samples. The data is optionally an average value or a approximation of an average value (The average value or approximation of the average value of T1 may be, e.g., obtained from existing sources, e.g., literature, previous experiments etc.).

In certain embodiments, the T1 value allows the map to also quantify T2 for a fluid in said sample, e.g., but not limited to cerebrospinal fluid (CSF) or tissues that have been modified (e.g., via contrast agents) to behave like fluids and to which $T1/T2 \gg \eta$ does not apply.

Primarily to economize on time during the acquisition of the T1, the sample may be subjected to at least one additional scan having a partial spoiling increment $\phi_y$, with $\phi_y \neq \phi_1, \phi_2$ and $\phi_x$, wherein $\phi_x$ is any partial spoiling increment of scans preceding $\phi_y$, and optionally acquiring from said additional scan at least one further MRI image of said sample.

DETAILED DESCRIPTION OF VARIOUS AND PREFERRED EMBODIMENTS

For a more complete understanding of the present invention and advantages thereof, references is now made to the following description of various illustrative and non-limiting embodiments thereof, taken in conjunction with the accompanying drawings.

Figure 1:
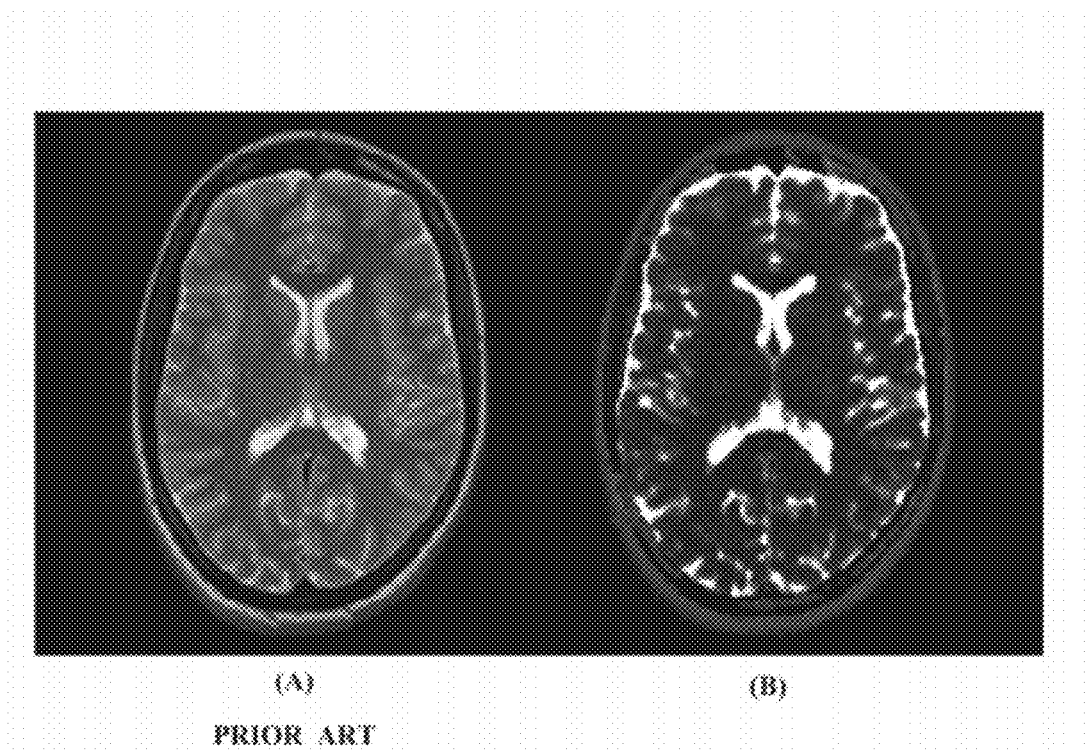
FIG. 1 illustrates the difference between a T2-weighted (A) and a quantitative T2 (B) magnetic resonance image (contrast mapping (A); parameter mapping (B)). Whereas the contrast between pixels in (A) is weighted by T2, the pixel intensity in (B) reflects the actual T2 of the tissue/fluid.

The difference between contrast-based and quantitative MRI is illustrated in FIG. 1, showing a T2-weighted image (A) and a quantitative T2 map (B) of the human brain. The axial image displayed in FIG. 1A was acquired using a SE sequence known in the art, whereas the image shown in FIG. 1B was acquired using one embodiment of the invention described herein. The contrast between pixels, such as between the cerebrospinal fluid (CSF) and gray matter (GM) or white matter (WM) in FIG. 1a is governed by the T2 relaxation times. This means, the longer the T2 value, the brighter the pixel. In contrast in FIG. 1B, a contrast similar to FIG. 1A is observed, but pixel intensities (PI) yield a direct quantitative measure of the T2 relaxation time (CSF PI~1200 ms, GM PI~70 ms, WM PI~50 ms). For different SE sequences, receiver coils, MR scanner hardware, the pixel intensities for T2-weighted images (as displayed in FIG. 1a) will be variable, whereas for the quantitative mapping technique shown in FIG. 1b, pixel values are essentially the same since they reflect a measure of a biochemical of biophysical tissue properties, which are independent of, e.g., of the MRI system used.

Figure 2:
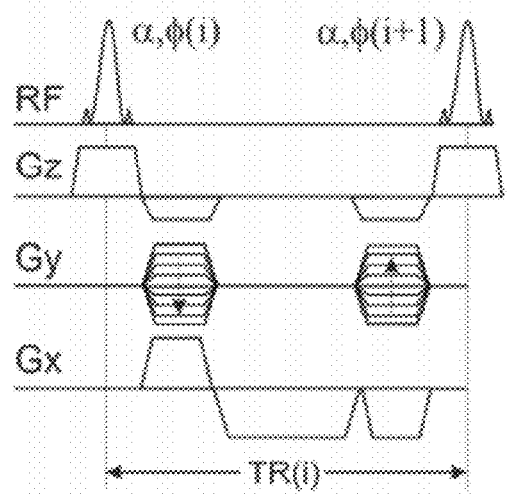
FIG. 2 shows a steady-state free precession (SSFP) sequence scheme acquiring the free induction decay (FID) signal pathway with a partial RF spoiling increment indicated by the parameter $\phi$. The signal readout features partial radiofrequency (RF) spoiling (pSSFP-FID). The phase of the RF pulses $\phi(i)$ is linearly incremented by the amount $\phi = \phi(i) - \phi(i-1)$.

The MRI imaging sequence used to derive quantitative T2 images is displayed in FIG. 2 and is described in detail by U.S. Pat. No. 7,262,599 to Ganter. Using a steady-state free precession (SSFP) sequence for imaging provides short repetition times, thus offering a considerable reduction in scan time as compared to conventional SE sequences. Radio-frequency (RF) spoiling, or more specifically, partial RF spoiling refers to a linear increment in the differential RF phase of consecutive excitation pulses $\phi_k - \phi_{k-1} = k\phi$, characterized by the phase shift increment $\phi$, wherein k is the running index of the "blocks" (RF blocks) within the sequence. The steady state depends sensitively on $\phi$, yielding SSFP for $\phi=0°$ and spoiled gradient echo (SPGR) for $\phi=50°$ or 117° (Ganter, 2006). It has been shown that for small TR and φ, the width of the transition from SSFP to SPGR is inversely proportional to T2. In one embodiment, the invention makes use of the approximate solution for partially spoiled SSFP (pSSFP) sequences (with repetition time TR and flip angle α) developed for small φ (Ganter, 2006). What constitutes a small φ depends on different parameters. However, generally a small φ is smaller than 50°, 40°, 30° or 20°, $$S_\phi(\alpha, TR, T_{1,2}) \approx \frac{\sin\alpha}{1-\cos\alpha} \cdot \frac{1}{\sqrt{\lambda^2+\phi^2}} \cdot \frac{\delta}{\xi} \quad [1]$$

$$\text{with } \lambda := \frac{2}{\xi} \cdot \frac{TR}{T_2}$$

where $\delta:=TR/T_1$ and the quantity $\zeta$ depends on the flip angle α and is given by a continued fraction expansion given in Eq. [34] in (4). Equation [1] is valid for $$\eta := 0.5 \frac{1+\cos\alpha}{1-\cos\alpha} \ll \frac{T_1}{T_2} \quad [2]$$

Indicating that for tissues with T1/T2~10, Eq. [1] is appropriate for α~60-70, whereas for fluids with T1/T2~2, a considerable increase in the flip angle to α>90° is needed. Unlike other SSFP-based T2 mapping techniques (2), sensitivity to T2 is modulated by the RF phase increment. Thus, the method presented herein is not susceptible to magnetization transfer, off-resonances, or other gradient related signal modulations such as diffusion.

Figure 3:
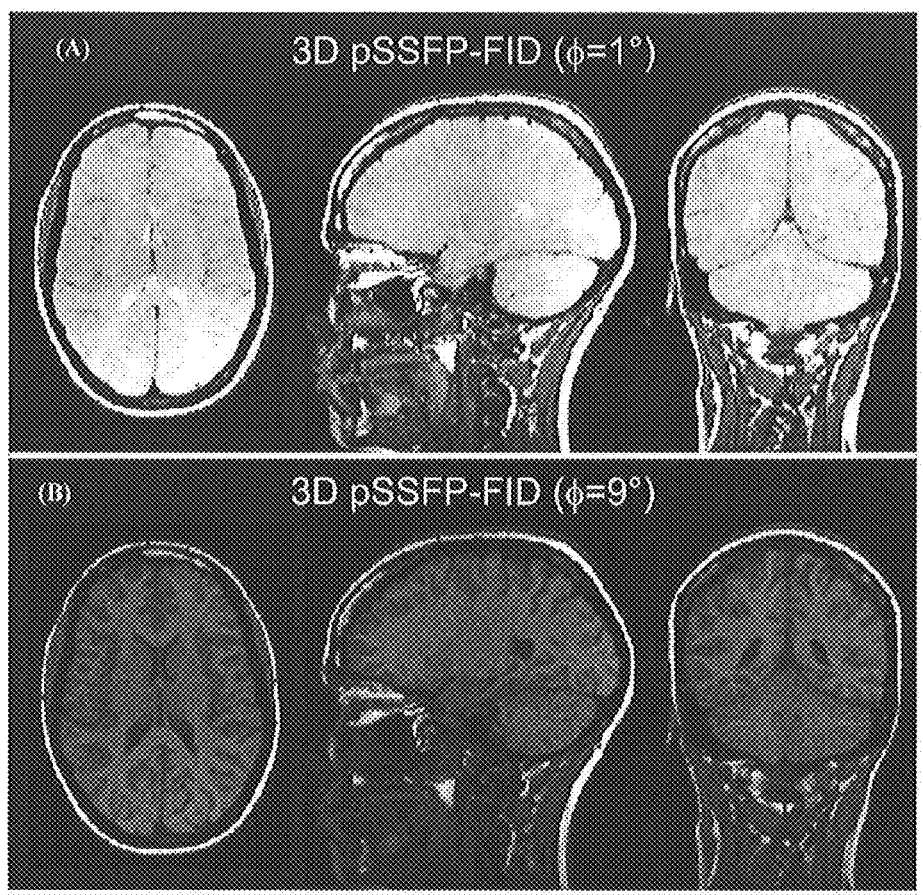
FIG. 3 shows from left to right axial, sagittal and coronal sample images of two 3D SSFP scans with different partial radiofrequency (RF) spoiling increments of $\phi=1°$ (A) and $\phi=9°$ (B) using the FID signal path for signal readout. The observed signal difference between the scan using $\phi=1°$ (A) and $\phi=9°$ (B) depends in the high flip angle (here, $\alpha=60°$) regime only on the flip angle, the repetition time (TR), the partial RF spoiling increments, thus external imaging-related sequence parameters, and on the tissue related intrinsic parameter T2. The efficiency of RF spoiling depends on the T2 and increases with increasing T2.

In one preferred embodiment of the present invention, two 3D scans with different partial RF spoiling increments were performed as illustrated in FIG. 3. Here, the SSFP-FID signal for readout as sketched in FIG. 2 is used in combination with partial RF spoiling increments of φ1=1° and φ2=9°. Further MRI imaging parameters were TR=5.4 ms and α=60°. The drop in the signal with increasing partial RF spoiling is visually apparent and is more pronounced for tissues or substances with longer T2 relaxation times. Generally, in the limit of large excitation angles satisfying Eq. [2] the T2 value can be assessed pixelwise from Eq. [1] for the two scans as displayed in FIG. 3, observing that $$f^2(TR, T_2\alpha, \phi_{1,2}) = \frac{S^2_{\phi1}(\alpha, TR, T_{1,2})}{S^2_{\phi2}(\alpha, TR, T_{1,2})} = \frac{\lambda^2+\phi^2_2}{\lambda^2+\phi^2_1} \quad [3]$$

to yield $$T_2(\phi_{1,2}, TR, \alpha) = \frac{2TR}{\xi} \cdot \sqrt{\frac{S^2_{\phi1}-S^2_{\phi2}}{S^2_{\phi2}\cdot\phi^2_2-S^2_{\phi1}\cdot\phi^2_1}} \quad [4]$$

Figure 4:
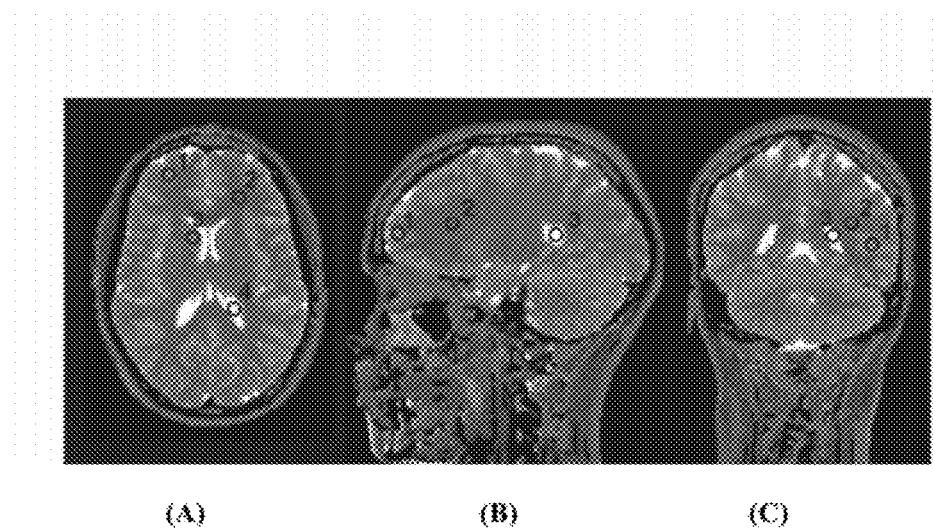
FIG. 4 shows (from left to right axial (A), sagittal (B) and coronal (C)) quantitative T2 maps obtained from the two partially spoiled SSFP-FID measurements as presented in FIG. 3. Accurate T2 estimates are found for tissues (T2/T1~0.1), whereas for fluids (T2/T1~1) underestimated T2 values are found. The results are as follows: (A): circle 1=98 ms, circle 2=63 ms, circle 3=83 and circle 4=950 ms; (B): circle 1=100 ms, circle 2=65 ms, circle 3=820; (C): circle 1=101 ms, circle 2=67 ms, circle 3=680.

The results for a pixelwise calculation of T2 from the two scans as shown in FIG. 3 are displayed in FIG. 4. T2 estimation is accurate for tissues but underestimates the T2 time for fluids such as CSF.

In another embodiment, precision might be increased by performing more than minimally two scans with different partial RF spoiling increments and T2 can be assessed using a linear regression analysis or any other fitting procedure to Eq. [1].

$$T_2^2 = A^2 \frac{S^2_{\phi1}-S^2_{\phi2}}{S^2_{\phi2}\cdot\phi^2_2-S^2_{\phi1}\cdot\phi^2_1} = \left(\frac{A}{\phi_1}\right)^2 \frac{1-S^2_{\phi1}/S^2_{\phi2}}{S^2_{\phi2}/S^2_{\phi1}\cdot\phi^2_2/\phi^2_1-1} \quad [5]$$

where $A=2TR/\zeta$ and for $\phi_1^2 \neq 0$ and $S_{\phi1}^2 \neq 0$. Using the definition of $\lambda:=S_{\phi2}^2/S_{\phi1}^2<1$ and $\Lambda:=\phi_2^2/\phi_1^2>1$, Eq [5] is rewritten to $$T_2^2 = \left(\frac{2TR}{\zeta\phi_1}\right)^2 \cdot \frac{1-\lambda}{\lambda\cdot\Lambda-1} = :a \cdot \frac{1-\lambda}{\lambda\cdot\Lambda-1} \quad [6]$$

thus identifying $x \equiv \lambda\Lambda-1$ and $y \equiv a(1-\lambda)$ Eq [6] is of linear form $$y = x \cdot T_2^2 \quad [7]$$

Figure 5:
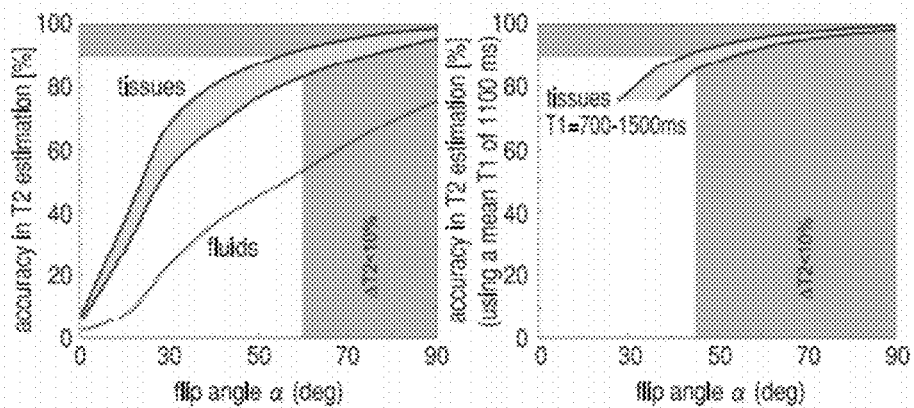
FIG. 5 shows the accuracy in the T2 determination as achievable using embodiments of present invention without T1 input. In the example shown, the T2 determination uses pSSFP-FID (TR=5 ms, $\phi=1°$, 9°, T1=700-1500 ms). The tissues have a T2/T1=1/20-1/10.
Figure 6:
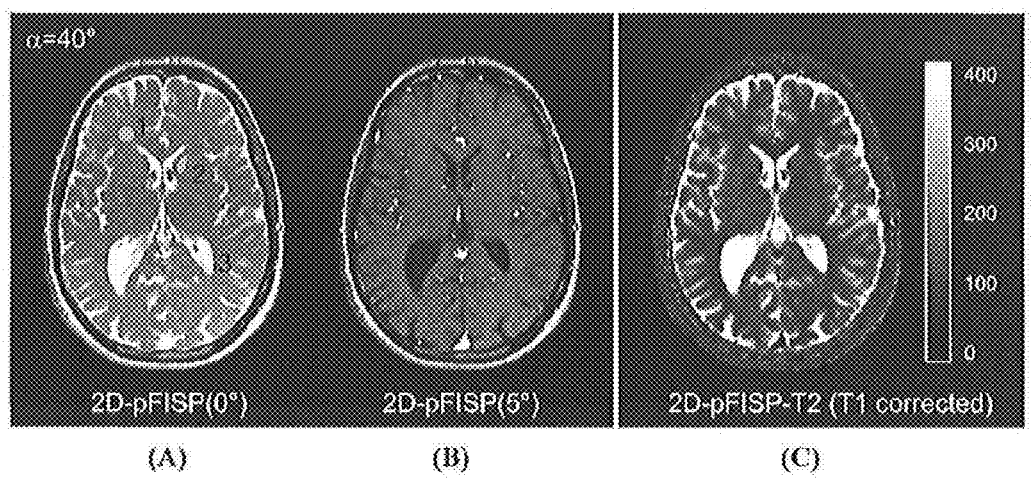
FIG. 6 shows derived T2 maps from 2D scans using T1 estimation (T2-pFISP); TR was approximately 10 ms. The 2D scan was completed within 0.5 minutes. (A): T2=68 ms ($\alpha=40°$); (B) T2=97 ms ($\alpha=40°$) and (C) T2=1400 ms ($\alpha=40°$ (with a T1 being estimated as 1000 ms) ("FISP" (SIEMENS) stands for SSFP-FIP; accordingly, pFISP stands for pSSFP-FIP).

In another embodiment of the invention presented herein, the methodology as described herein can be extended to lower flip angles in order to achieve a higher signal to noise ratio (SNR) (since most tissues yield an optimal SNR for α~30° for T2/T1~0.1). However, knowledge of T1, similar to that acquired by DESPOT1 (Deoni et al., 2003) is desirable in order to yield an accurate estimate for T2 using the full signal description for pSSFP (FIGS. 5, 6). Generally, the accuracy in T2 can be increased by giving an estimation for the T1 value, if the possible range of T1 values are known or can be guessed (FIG. 5). The accuracy with lower flip angles can be increased using a rough estimation of T1~1100 ms, being the mean of a typical range of T1 values at 1.5 T of 700-1500 ms. Other T1 estimates that can be used as a T1 that is provided in the context of the present invention include, for example, 1000 or 1200, or any other value between 700 and 1500, preferably 1000 and 1200.

In another embodiment of the invention presented herein, preferably, however, the large flip angle regime should be maintained in order to keep the insensitivity on T1. Using considerably long RF pulses has mainly two important advances: (i) magnetization transfer (MT) effects are reduced and thus SNR is increased and (ii) the flip angle for optimal SNR is shifted to higher values (i.e., from 30° to 60°). As a result, using long RF pulses, a considerable increase in SNR can be achieved at large excitation angles for use with T2 mapping using pSSFP thereby bypassing the need of T1 information.

Once given the above disclosure, many other features, modifications, and improvements will become apparent to the skilled artisan. Such other features, modifications, and improvements are therefore considered to be part of this invention, the scope of which is to be determined by the following claims.

BIBLIOGRAPHY

Boulby P H and Rugg-Gunn F. Quantitative MRI of the Brain, Chapter 6. Edited by Paul Tofts, 2003 John Wiley and Sons; ISBN: 0-470-84721-2.
Crooijmans, H, Gloor, M, Bieri, O, and Scheffler, K. Influence of MT effects on T2 quantification with 3D balanced steady-state free precession imaging. Magn. Reson. Med. 2010; in press.
Deoni, S L C, Rutt, B K, and Peters, T M. Rapid Combined T1 and T2 Mapping Using Gradient Recalled Acquisition in the Steady State. Magn. Reson. Med. 2003; 49:515-526.
Ganter. Method and control device for obtaining magnetic resonance data for imaging, U.S. Pat. No. 7,262,599.

Ganter. Steady State of Gradient Echo Sequences with Radiofrequency Phase Cycling: Analytical Solution, Contrast Enhancement with Partial Spoiling. Magn. Reson. Med. 2006; 55:98-107.

What we claim is:

1. A magnetic resonance imaging (MRI) method for quantification of a transverse relaxation time (T2) comprising
subjecting a sample to a first partially spoiled SSFP (pSSFP) scan having a first partial radio frequency (RF) spoiling increment $\phi_1$ and acquiring from said scan a first MRI image of said sample,
subjecting said sample to a second pSSFP scan with a second partial RF spoiling increment $\phi_2$ and acquiring from said scan a second MRI image of said sample, wherein $\phi_2 > \phi_1$ or $\phi_2 < \phi_1$,
deriving a map of the T2 from said first and second image, wherein said map quantifies T2 for tissue in said sample.

2. The MRI method of claim 1, wherein the tissue is brain tissue, muscle or cartilage.

3. The method of claim 1, wherein $\phi_1$ and $\phi_2$, respectively are less than about 50°, about 40°, about 30°, about 20°, most preferably less than or equal to 10°, 9°, 8°, 6°, 5°, 4°, 3°, 2°, 1° or 0°.

4. The method of claim 3, wherein $\phi_2$ and $\phi_1$ differ from each other by 10°, 9°, 8°, 6°, 5°, 4°, 3°, 2° or 1°.

5. The method of claim 4, wherein both $\phi_1$ and $\phi_2$ are each less than 20°, 15° and most preferably less than 10°.

6. The method of claim 1, wherein said sample is subjected at least one additional pSSFP scan having a partial spoiling increment $\phi_y$, and acquiring from each additional scan a further MRI image of said sample, wherein $\phi_y \neq \phi_1$, $\phi_2$ and $\phi_x$, wherein $\phi_x$ is any partial spoiling increment of any additional scan preceding $\phi_y$, and wherein said map is derived from said first, second and said at least one further image.

7. The method of claim 1, wherein a flip angle of the RF pulses of said pSSFP of said first, second and any additional scan exceeds or is equal to 50° or 60°, more preferably exceed or is equal to 70°, more preferably exceed or is equal to 80° and wherein signals making up said map are independent of a longitudinal relaxation time (T1).

8. The method of claim 7, further comprising providing a T1
 (i) from acquiring T1 by subjecting said sample to a method for quantifying T1, or
 (ii) from data previously obtained for one or more previous samples, wherein said data is optionally an average value or a approximation of an average value, wherein said T1 is used to further quantify T2 for a fluid in said sample.

9. The method of claim 7, wherein the pulse sequence repetition time (TR) of the RF pulses is more than or equals 3 ms, but less than 15 ms, preferably more than 5 ms, but less than 10 ms including more than 6 ms, 7 ms, 8 ms or 9 ms.

10. The method of claim 1, wherein a flip angle of the RF pulses of said pSSFP of said first, second and any subsequent scan is less than 60°, preferably less than or equal to 50° or 40°, even more preferably less than or equal to 30° rendering T2 of the respective pSSFP dependent on a longitudinal relaxation time (T1) and wherein said T1 is provided:
 (i) from acquiring T1 by subjecting said sample to a method for quantifying T1, or
 (ii) from data previously obtained for one or more previous samples, wherein said data is optionally an average value or a approximation of an average value.

11. The method of claim 10, wherein the average value or approximation of the average value of T1 is obtained from existing sources.

12. The method of claim 10 or 11, wherein said T1 is acquired by subjecting said sample to a method for quantifying T1 and wherein said map further quantifies T2 for a fluid in said sample.

13. The method of claim 12, wherein said fluid is cerebrospinal fluid (CSF).

14. The method of claim 12, wherein, during a time interval of acquiring said T1, said sample is subjected to at least one additional scan having a partial spoiling increment $\phi_y$, with $\phi_y \neq \phi_1$, $\phi_2$ and $\phi_x$, wherein $\phi_x$ is any partial spoiling increment of any scan preceding $\phi_y$, and optionally acquiring from said additional scan at least one further MRI image of said sample.

* * * * *